United States Patent
Van Scyoc et al.

[11] Patent Number: 5,859,766
[45] Date of Patent: Jan. 12, 1999

[54] ELECTRICAL HOUSING FOR CIRCUIT BOARD ASSEMBLY

[75] Inventors: William Crusey Van Scyoc, Shippensburg; Ronald Martin Weber, Annville, both of Pa.

[73] Assignee: The Whitaker Corporation, Wilmington, Del.

[21] Appl. No.: 808,696

[22] Filed: Feb. 28, 1997

[51] Int. Cl.$^6$ ..................................... H05K 5/00
[52] U.S. Cl. .......................... 361/752; 361/737; 361/756; 439/362
[58] Field of Search .................. 361/728, 738, 361/737, 740, 748, 752, 756, 801; 439/76.1, 362

[56] References Cited

U.S. PATENT DOCUMENTS

| | | | |
|---|---|---|---|
| 4,221,458 | 9/1980 | Hughes et al. | 339/126 R |
| 5,007,858 | 4/1991 | Daly et al. | 439/498 |
| 5,162,000 | 11/1992 | Frantz | 439/607 |
| 5,197,900 | 3/1993 | Ellis et al. | 439/352 |
| 5,217,394 | 6/1993 | Ho | 439/620 |
| 5,218,758 | 6/1993 | Nguyen | 29/837 |
| 5,266,047 | 11/1993 | Black et al. | 439/364 |
| 5,342,216 | 8/1994 | Davis et al. | 439/362 |
| 5,386,487 | 1/1995 | Briggs et al. | 385/59 |
| 5,430,618 | 7/1995 | Huang | 361/818 |
| 5,647,758 | 7/1997 | Ichikawa et al. | 439/362 |

FOREIGN PATENT DOCUMENTS

| | | | |
|---|---|---|---|
| 0668715 A1 | 8/1995 | European Pat. Off. | H05K 7/20 |
| 531801 | 12/1972 | Sweden | H01R 23/02 |

OTHER PUBLICATIONS

International Search Report in corresponding PCT/US98/02360 mailed May 18, 1998; three pages.

*AMP Customer Drawing No. 749556*, "Plug Subassembly, 40 Position, Termination Connector, Amplimite, .050 Series", Jan. 15, 1990; AMP Incorporated, Harrisburg, PA.

*Primary Examiner*—Leo P. Picard
*Assistant Examiner*—Jayprakash N. Gandhi
*Attorney, Agent, or Firm*—Marshall E. Rosenberg; Anton P. Ness

[57] ABSTRACT

An electrical housing (12) for a circuit board assembly (14) comprises interfitting upper and lower housing members (16,18) along which the circuit board assembly is disposed when the housing members are fitted and secured together. End members (56,58) are secured to the respective ends of housing (12) with outer ends of connectors (52,54) extending through slots (65) in the end members. Jack screws (64) have shafts (66) extending through holes (63) of the end members, through channels in the housing members formed by opposing arcuate recesses (40,48) in the housing members (16,18) and clips (69) are pressed onto the shafts (66) to secure and capture the jack screws (64) in housing (12).

14 Claims, 3 Drawing Sheets

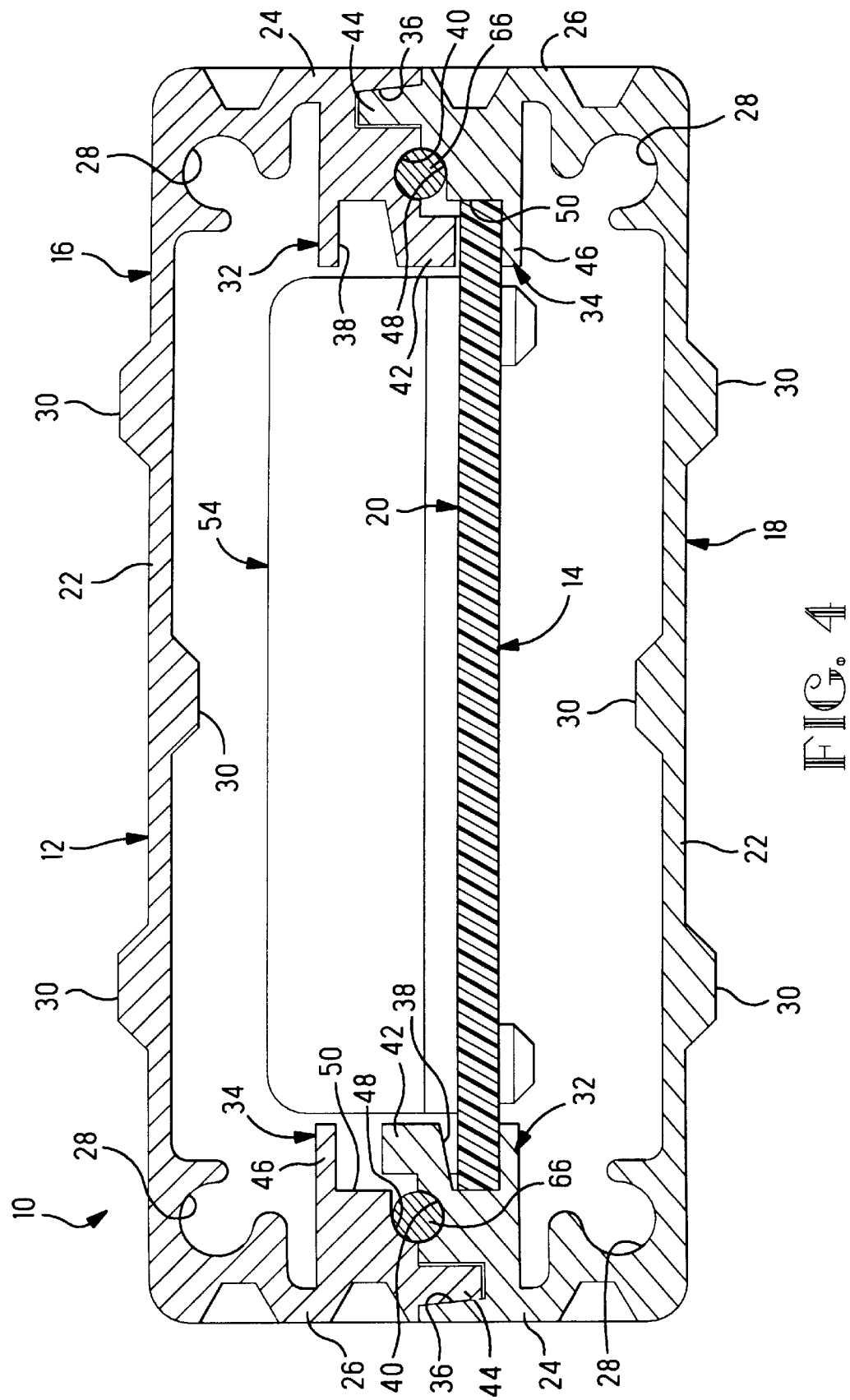

5,859,766

1

ELECTRICAL HOUSING FOR CIRCUIT BOARD ASSEMBLY

FIELD OF THE INVENTION

The present invention relates to electrical housings and more particularly to electrical housings for circuit board assemblies.

BACKGROUND OF THE INVENTION

Media Independent Interface (MII) Transceivers are used to connect workstations to Fast Ethernet hubs, switches and routers. These transceivers typically include circuit board assemblies having interconnected mother and daughter boards or mother boards on which electrical connectors or electrical connectors and fiber optic connectors are provided. In one type of transceiver, the circuit board assemblies are mounted in electrical housings having jack screws for mounting the transceivers to hubs and switches. The electrical housings used in these transceivers are stamped and formed from metal sheets resulting in large-size housings that are bulky and require a lot of metal to make. The assembly of the various parts to form the transceivers is very difficult because of the number of parts involved and alignment of the parts in the housing is also difficult. Tooling is also costly and time consuming to build; therefore, is not suited for lower volume production. These operations are time consuming, thereby increasing the cost of the transceivers. Moreover, the jack screws are floatably mounted in the housings and not captured therein. In another type of transceiver, a one-piece extruded housing is used which is not capable of securely clamping the circuit board assembly therein, because the circuit board assembly is slid into the housing and not accurately placed therein.

Accordingly, a need arose to provide an electrical housing that would enable circuit board assemblies to be easily positioned and securely aligned therein in an efficient and cost-saving manner.

In addition, there has been a need to provide an electrical housing with jack screws captured therein so that they would not float and remain in place.

SUMMARY OF THE INVENTION

The electrical housing for circuit board assemblies having connectors thereon, comprises interfitting upper and lower housing members along which a circuit board assembly is disposed when the housing members are fitted and secured together. Separate end members secured to housing ends have connector-engaging portions for engaging the connectors on the circuit board assembly for positioning the circuit board assembly longitudinally relative to the housing members and maintaining the connectors in position therebetween. Positioning members are provided on the housing members for vertically positioning the circuit board assembly within the housing members, and jack screw-securing members are secured to jack screws for positioning the jack screws within the housing members and maintaining the jack screws in position therein so that they are operationally captured therein. The circuit board assembly positioning members form a ground connection with the circuit board assembly. Preferably, each housing is extruded such as of aluminum and then cut to length, and also the housings may be hermaphroditic.

BRIEF DESCRIPTION OF THE DRAWINGS

An embodiment of the present invention will now be described by way of example with reference to the accompanying drawings.

2

Figure 1:
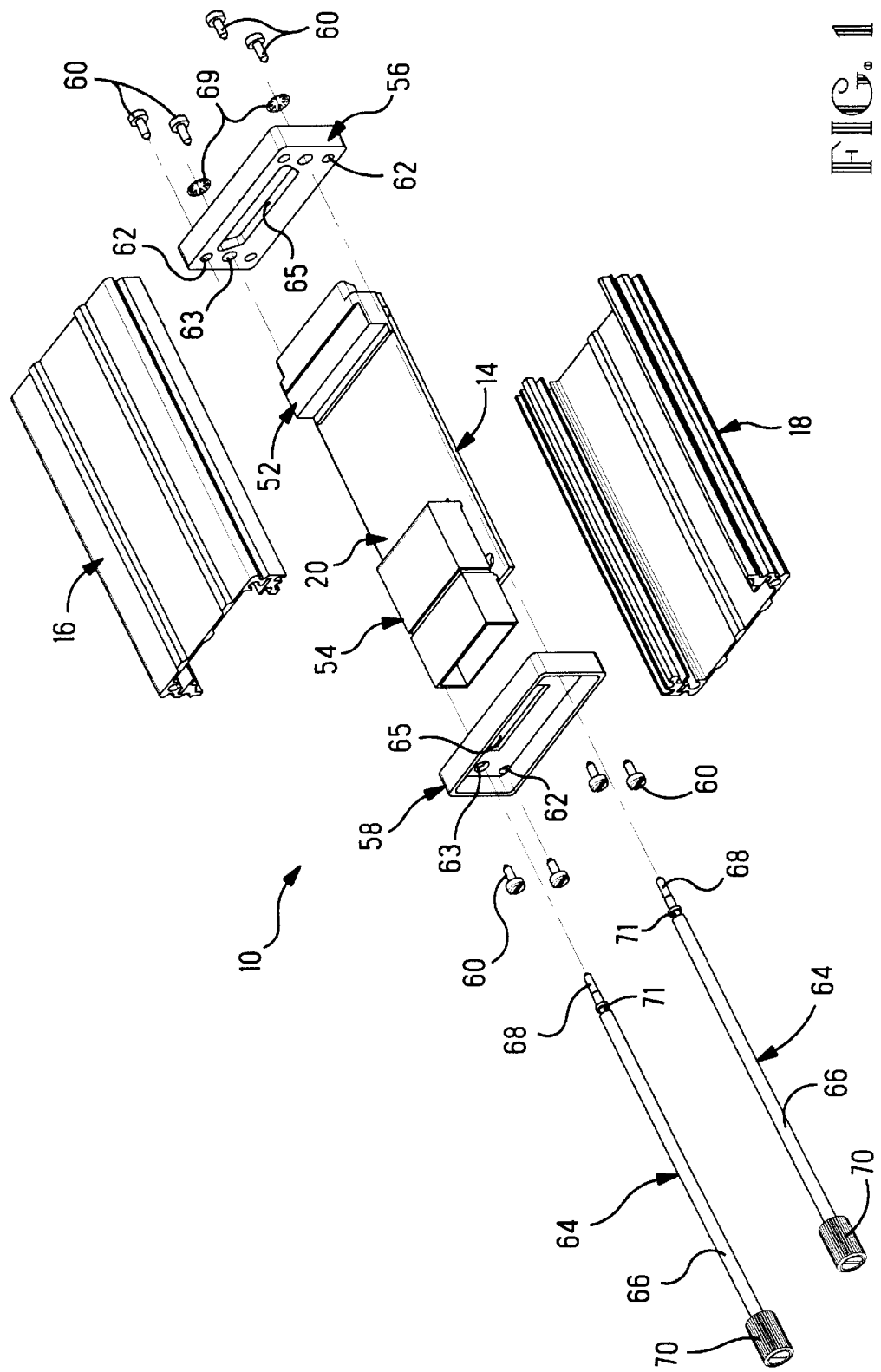
Figure 2:
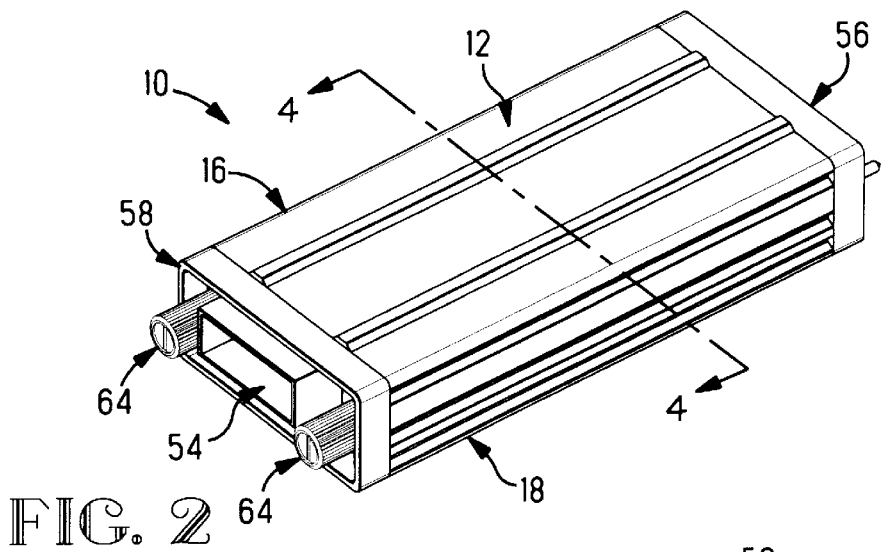
Figure 3:
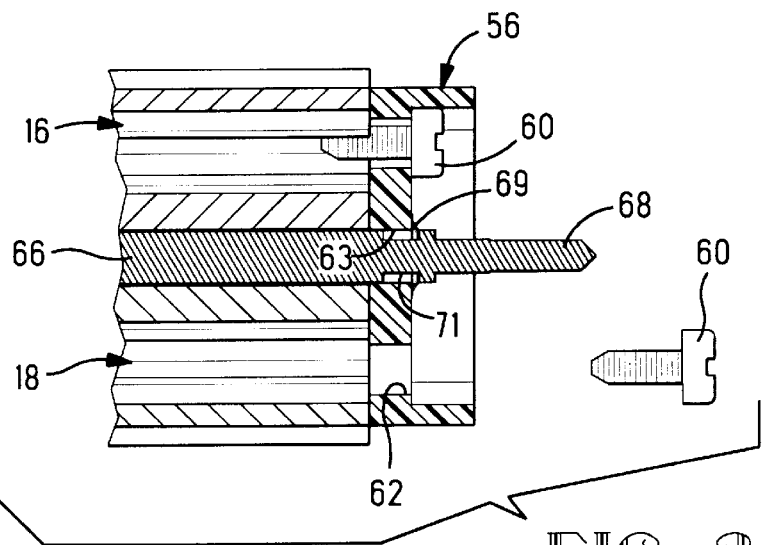
Figure 5:
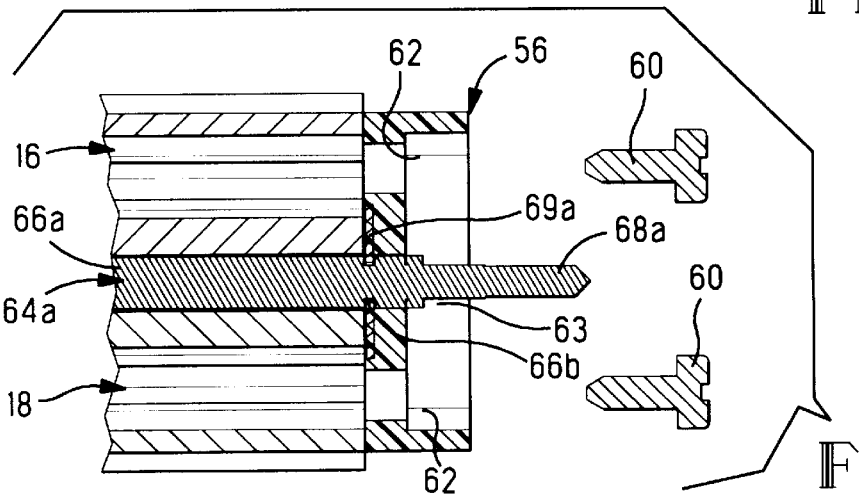

FIG. 1 is a perspective and exploded view of a Media Independent Interface Transceiver including a circuit board assembly, an electrical housing therefor, end members and jack screws;

FIG. 2 is a perspective view showing FIG. 1 in an assembled form;

FIG. 3 is an enlarged cross-sectional view of a forward end of a jack screw secured within an end member of the electrical housing;

FIG. 4 is a cross-sectional view taken along line 4—4 of FIG. 2; and FIG. 5 is a part cross-sectional view of an alternative embodiment.

DETAILED DESCRIPTION OF THE INVENTION

As shown in FIGS. 1 to 4, a Media Independent Interface (MII) Transceiver 10 comprises a metal housing 12 and a circuit board assembly 14. The MII Transceiver is to be used to connect workstations, switches or hubs to other Fast Ethernet workstations, hubs and switches. While the present invention relating to the electrical housing is used in conjunction with the circuit board assembly forming the electronic circuits of the transceiver, other circuit board assemblies for other electronic circuits can be housed in the electrical housing.

Electrical housing 12 includes an upper housing member 16 and a lower housing member 18, which interfit with one another; circuit board assembly 14 includes a circuit board 20.

Upper housing member 16 and lower housing member 18 are formed as hermaphroditic extruded metal members in accordance with conventional metal extruding practices and the metal used is preferably aluminum. Thus, a single extruding mold is used and the housing members are cut to the desired length and interfitted to form housing 12 to house circuit board assembly 14.

Due to housing members 16,18 being of the same configuration, they will be described together. Each housing member 16,18, as shown in FIG. 4, comprises a wall 22 and side walls 24,26 which form a generally U-shape configuration in cross section. Part-circular recesses 28 are located at the corners of housing members 16,18 and outer and inner parallel projections 30 having tapered sides and planar outer surfaces extend along walls 22 to make the walls more rigid and strong. Side walls 24 have inwardly-directed platforms 32, and side walls 26 also have inwardly-directed platforms 34.

Platforms 32 have an outer recess 36, an inner recess 38 and an arcuate recess 40 disposed therebetween which faces outwardly in the same direction as outer recess 36. Inner recess 38 faces inwardly and is disposed normal to outer recess 36. Outer and inner recesses 36,38 have tapered surfaces opposite respective vertical and horizontal surfaces. A projection 42 extends above the surface containing arcuate recess 40 and is spaced inwardly therefrom.

Platforms 34 have outer and inner projections 44, 46 which are disposed normal to one another. An arcuate recess 48 is located between projections 44,46. A planar surface 50 connects arcuate recess 48 and inner projection 46. Outer projection 44 has tapered and vertical surfaces.

Circuit board 20 of the circuit board assembly 14 has an electrical connector 52 connected to one end and a fiber optic connector 54 connected to the other end. Fiber optic connector 54 is disclosed in U.S. Pat. No. 5,386,487 and electrical connector 52 is of the type identified as Part No. 174218-2 of AMP Incorporated, Harrisburg, Pa.

Turning to FIG. 1, circuit board assembly 14 is positioned in housing 12 and secured between housing members 16,18 via end members 56,58 which abut against the ends of housing members 16,18. Screws 60 extend through holes 62 in end members 56,58, and they have thread-forming shanks that form threads in part-circular recesses 28 in housing members 16,18 without forming any metal chips, thereby securing the housing members 16,18 together to form housing 12.

End members 56,58 can be metal die cast members, plastic molded members or metal plates stamped from sheet metal.

Jack screws 64 have shafts 66 with threaded ends 68 and operating knobs 70 at opposite ends. Shafts 66 extend through holes 63 in end members 56,58 and through the openings formed by arcuate recesses 40,48 of platforms 32,34 when housing members 16,18 are assembled (see FIG. 4). TINNERMAN brand retaining clips 69 or the like are pressed on the ends of shafts 66 that protrude beyond end member 54 including the threaded ends, as shown in FIG. 3, with clips 69 seating in reduced diameter sections 71 of shafts 66 at least outwardly of housing 12, all thereby securing and capturing the jack screws 64 within the housing 12.

Slots 65 are provided in end members 56,58 to accommodate the outer ends of connectors 52,54 when end members 56,58 are secured to the respective ends of housing 12.

To assemble the circuit board assembly 14 into housing 12 to form a Media Independent Interface Transceiver 10, circuit board assembly 14 is positioned in lower housing member 18 as shown in FIG. 4 whereby one edge of circuit board 20 is disposed in inner recess 38 of platform 32 and a second edge of circuit board 20 is positioned on projection 46 of platform 34. Upper housing member 16 is then positioned in place on lower housing member 18 and circuit board 20 whereby outer projection 44 of platform 34 is received in outer recess 36 of platform 32 and projection 42 of platform 32 engages the second edge of circuit board 20 along the right hand side of FIG. 4. Along the left hand side of FIG. 4, outer projection 44 of platform 34 is disposed in outer recess 36 of platform 32.

End members 56,58 are secured to respective ends of housing 12 via thread-forming screws 60 extending through holes 62 in end members 56,58 and form threads in respective part-circular recesses 28 in housing members 16,18. The outer ends of connectors 52,54 extend through slots 65 in the end members 56,58. Securing of end members 56,58 to housing members 16,18 secures housing members 16,18 together thereby forming housing 12 and positions the circuit board assembly 14 longitudinally within housing 12 with the outer ends of connectors 52,54 accessible for connection to mating connectors.

Shafts 66 of jack screws 64 are fed through holes 63 in end member 58 and through channels formed by opposing arcuate recesses 40,48 of opposing platforms 32,34 of housing members 16,18 until the threaded ends 68 are disposed in holes 63 of end member 56 and extend outwardly therebeyond. Clips 69 are pressed onto the protruding ends of shafts 66 seating in reduced diameter sections 71 outwardly of end member 56 (FIG. 3) for securing and capturing jack screws 64 within housing 12. This leaves operating knobs 70 and threaded ends 68 extending outwardly from respective end members 56,58.

The edges of circuit board 20 are provided with a ground circuit path which is electrically connected to housing 12 via projections 42,46 of platforms 32,34 thereby grounding circuit board 20 to housing 12.

The interfitting of housing members 16,18 via outer projections 44 within outer recesses 36 prevents EMI and RFI leakage. Platforms 32,34 provide positioning members for vertically positioning circuit board assembly 14 within housing members 16,18. End members 56, 58 position circuit board assembly 14 longitudinally within housing 12.

FIG. 5 shows an alternative embodiment wherein shafts 66a of jack screws 64a have an annular groove 66b adjacent threaded ends 68a. An E-clip 69a is snapped into grooves 66b whereafter end member 56 is secured to the end of housing 16 via screws 60 with threaded ends 68a extending through holes 63. Optionally, E-clips 69a could be disposed in recesses (not shown) along the inner surfaces of end member 56.

An important feature of the present invention is the capturing of jack screws in housing 12 and these jack screws assist in the connection and disconnection of connector 52 with its mating connector.

Another important feature of the present invention is that the shape of housing 12 enables connection of the transceivers to adjacent units without any interference A further feature of the present invention is the ease of assembly of the parts to form the transceivers thereby resulting in lower costs. Also, tooling required to manufacture the housings is minimal when compared with other techniques. For prototype and low volume housings, this is the most cost effective approach.

An additional feature of the present invention is that the housing members 16,18 forming housing 12 are hermaphroditic thereby requiring only one extruding die to form both housing members.

What is claimed is:

1. An electrical housing for a circuit board assembly having at least one electrical connector thereon, comprising:

interfitting upper and lower housing members along which a circuit board assembly is disposed when the housing members are fitted and secured together;

end members secured to respective ends of the housing members for positioning the circuit board assembly longitudinally relative to the housing members and with one end of the end members having a slot through which an outer end of the electrical connector extends;

positioning members provided by the housing members for vertically positioning the circuit board assembly within the housing members;

jack screws having shafts extending through holes in the end members; and retaining clips to be affixed to the jack screw shafts for securing and capturing the jack screws within the housing members.

2. An electrical housing as claimed in claim 1, wherein said retaining clips are pressed onto ends of said jack screw shafts and seated within reduced diameter sections thereat.

3. An electrical housing as claimed in claim 1, wherein said retaining clips are E-clips snapped into annular grooves in said jack screw shafts.

4. An electrical housing as claimed in claim 1, wherein said housing members are hermaphroditic and wall and side walls forming a U-shape configuration.

5. An electrical housing as claimed in claim 4, wherein said wall of said housing members have inner and outer parallel projections to make said wall more rigid and strong.

6. An electrical housing as claimed in claim 4, wherein the housing members have part-circular recesses for receiving thread-forming screws for securing the end members to the housing members.

7. An electrical housing as claimed in claim 4, wherein said positioning members comprise platforms extending inwardly from the side walls of said housing members.

8. An electrical housing as claimed in claim 7, wherein said platforms include outer projections disposed within outer recesses so that said housing members interfit with one another.

9. An electrical housing as claimed in claim 7, wherein said platforms have opposing arcuate recesses defining channels along which said jack screw shafts extend.

10. An electrical housing as claimed in claim 7, wherein one of the platforms includes an inner recess for receiving a first edge of a circuit board of the circuit board assembly, another of the platforms has an inner projection on which a second edge of the circuit board is to be disposed.

11. An electrical housing as claimed in claim 10, wherein a further one of the platforms opposing the another of the platforms has a projection engaging the second edge of the circuit board thereby securing the second edge of the circuit board between said projection and said inner projections and form a ground connection therewith.

12. An electrical housing for a circuit board assembly having at least one electrical connector thereon comprising interfitting upper and lower housing members along which a circuit board assembly is disposed when the housing members are fitted and secured together, one end of the housing members having a connector-receiving slot in which the electrical connector is disposed, and jack screws mounted in the housing members, characterized in that first positioning members are provided on the housing members for vertically positioning the circuit board assembly within the housing members, second positioning members are provided by the housing members and the electrical connector for positioning the circuit board assembly longitudinally relative to the housing members, and jack screw-securing members are secured to the jack screws for positioning the jack screws within the housing members and maintaining the jack screws in position therein so that the jack screws are operationally captured therein;

wherein the jack screw-securing members are retaining clips to be affixed to the jack screw shafts.

13. An electrical housing for a circuit board assembly as claimed in claim 12, wherein the retaining clips are secured within reduced diameter sections of the jack screw shafts.

14. An electrical housing for a circuit board assembly as claimed in claim 12, wherein the retaining clips are E-clips snapped into annular grooves provided in the jack screw shafts.

* * * * *